USO05197993A

United States Patent [19]
Ferrando et al.

[11] Patent Number: 5,197,993
[45] Date of Patent: Mar. 30, 1993

[54] LIGHTWEIGHT BATTERY ELECTRODE AND METHOD OF MAKING IT

[75] Inventors: William A. Ferrando, Arlington; Amarnath P. Divecha, Falls Church, both of Va.

[73] Assignee: The United States of America as represented by the Secretary of the Navy, Washington, D.C.

[21] Appl. No.: 728,915

[22] Filed: Jul. 11, 1991

[51] Int. Cl.⁵ .................................................. B05D 3/00
[52] U.S. Cl. ........................................ 29/2; 29/623.5; 427/331
[58] Field of Search .................... 29/2, 623.5; 427/212, 427/229, 237, 250, 331; 264/56, 105, 126, 258; 429/235, 245

[56] References Cited
U.S. PATENT DOCUMENTS

| 1,081,531 | 12/1913 | Hubbell | 429/235 X |
| 4,215,190 | 7/1980 | Ferrando et al. | 429/222 |
| 4,476,206 | 10/1984 | Viala et al. | 29/2 X |
| 4,861,690 | 8/1989 | Hope et al. | 429/245 X |
| 5,080,963 | 1/1992 | Tatarchuk et al. | 429/235 X |

Primary Examiner—Anthony Skapars
Attorney, Agent, or Firm—Kenneth E. Walden; Roger D. Johnson

[57] ABSTRACT

A process for producing a lightweight electrode grid by exposing a heated mat of dense graphite fibers to Ni(CO)$_4$ gas wherein the Ni(CO)$_4$ decomposes upon contact with the graphite fibers depositing nickel metal coating on the graphic fibers. The nickel coated graphite fibers are then sintered to form the grid. Nickel or cadmium electrodes are made by attaching a current collector to the grid and impregnating the grid with the appropriate nickel or cadmium active material.

11 Claims, 4 Drawing Sheets

LIGHTWEIGHT BATTERY ELECTRODE AND METHOD OF MAKING IT

BACKGROUND OF THE INVENTION

This invention relates to electrochemical cells and more particularly to sintered nickel plates for electrochemical cells.

In the nickel-cadmium alkaline cell, porous nickel plates are used to construct both the positive and negative electrodes. The active material for the positive and negative electrodes is contained within the nickel plates. The positive plate contains nickel hydroxide while the negative plate contains cadmium hydroxide. The most efficient structural construction is the sintered nickel plate. This plate is designed for a high surface area to plate volume ratio. To form the plates, fine nickel powder (carbonyl nickel) on a wire screen is placed in a mold and sintered at elevated temperatures (700° –1000° C.) in a reducing atmosphere. The result is a plate (plaque) about 0.030–0.060 inches thick and 70–85% void (porosity).

Sintered nickel plates are lighter and have grater effective areas than do solid nickel plates. However, sintered nickel plates are limited by several factors to certain minimum weights. For example, very high porosities produce a structurally weak plaque which cannot endure the electrical stresses involved in impregnation and cycling. On the other hand if large cavities (pockets) are designed into the plate to hold significant amounts of active material, the problem becomes one of maintaining sufficient electrical conductivity.

In U.S. Pat. No. 3,476,604 titled "Method of Making an Electrode Grid," issued to Peter Faber on Nov. 4, 1969, an electrode grid is formed by sintering a web of nickel-boron coated carbonaceous fibers. In that method, a fabric or felt of cellulose fibers was first charred to produce a web of carbonaceous filaments. These carbonaceous filaments were than at least partially graphiticized. Next, an aqueous solution of a nickel salt in the presence of a reducing boron compound was used to deposit a nickel-boron coating on the carbonaceous filaments. Finally, the web of nickel-boron coated carbonaceous filaments was sintered to form the nickel electrode grid. There are several disadvantages to this approach. First, if carbon or graphite fibers formed by charring materials such as rayon or cellulose fibers are used to produce the sintered nickel electrode grids, the grids swell upon cycling in an alkaline (e.g., KOH) electrolyte. Additionally, carbon or graphite fibers formed in this manner are expensive. Finally, the high purity reducing boron compounds required in the Faber process are very expensive.

In U.S. Pat. No. 4,215,190, titled "Lightweight Battery Electrode," issued to William A. Ferrando and Raymond A. Sutulla on Jul. 29, 1980, an electrode grid is formed by sintering a web of nickel-phosphorous coated graphite fibers having a graphite density of 1.8 g/cm$^3$ or more. The process is cheaper than Faber's process and the dense graphite fibers more resistant to swelling in alkaline electrolytes. Nevertheless, it would be desirable to reduce the cost of producing the nickel grid further. Further, although the phosphorous does not interfer with the electrochemical performance of the nickel, it still acts a diluent, reducing the available nickel surface by as much as 15 percent.

It would be desirable to produce a nickel grid that would possess the lightweight and durableness of the Ferrando et al. grid but which would be cheaper to produce and would have a pure nickel surface available.

SUMMARY OF THE INVENTION

Accordingly, an object of this invention is to provide a more economical method of producing strong, lightweight nickel grids for battery electrodes.

Another object of this invention is to provide a method of producing strong, lightweight nickel grids having nickel surfaces that are nearly 100 percent nickel.

A further object of this invention is to provide new low cost, strong, lightweight nickel grids for batteries.

These and other objects of this invention are accomplished by providing a process for producing a lightweight electrode grid by A. heating a mat of dense graphite fibers to a temperature at which Ni(CO)$_4$ decomposes;

B. exposing the heated mat of graphite fibers to Ni(CO)$_4$ gas which is at a temperature above the vaporization temperature of Ni(CO)$_4$ but below the decomposition temperature of Ni(CO)$_4$, wherein the Ni(CO)$_4$ decomposes when it contacts the heated graphite fibers and deposits nickel metal on the graphite fiber surfaces;

C. removing the heated graphite fiber mat from the Ni(CO)$_4$ gas when the desired thickness of nickel metal coating has been produced on the graphite fiber mat; and D. sintering the nickel coated graphite fiber mat in a reducing atmosphere under heat and pressure to compress the mat to a desired thickness and to fuse the nickel metal coated graphite fibers together.

The grid that is produce can be used to produce an electrode by attaching a current collector to the grid and then impregnating the grid with a nickel active material or a cadmium active material to produce a nickel or a cadmium electrode.

BRIEF DESCRIPTION OF THE DRAWING

A more complete understanding of the invention and many of the attendant advantages thereto will be readily appreciated as the same becomes better understood by reference to the following detailed description when considered in connection with the accompanying drawings wherein.

DETAILED DESCRIPTION OF THE PREFERRED EMBODIMENT

Figure 1:
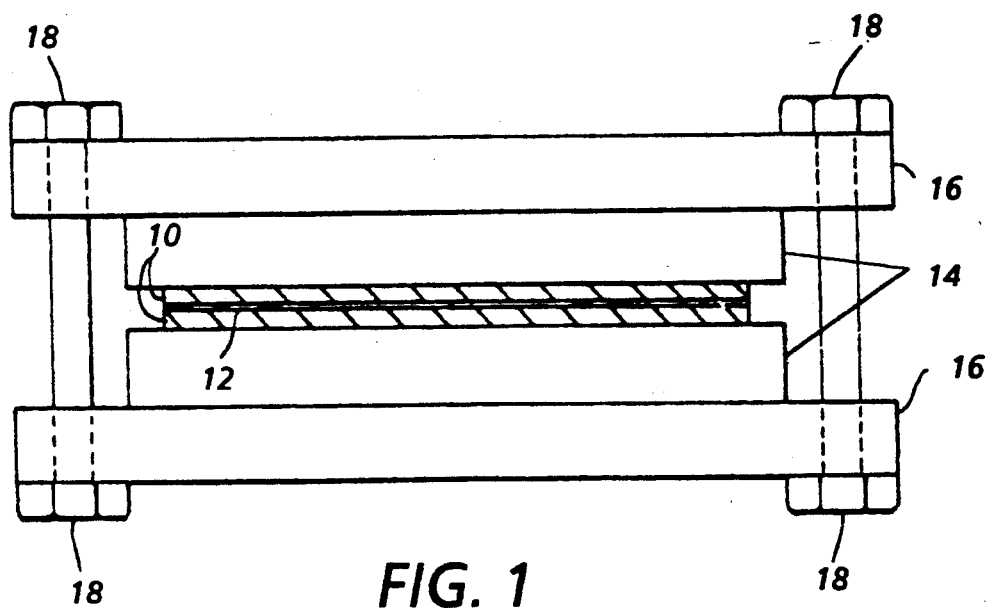
FIG. 1 is a side schematic view of an apparatus for sintering nickel metal coated graphite fiber mats.

The present invention provides a method of producing a new nickel electrode grid by coating high density graphite fibers in the form of a mat or web with pure 99+ %) nickel metal produced by decomposing nickel carbonyl, Ni(CO)$_4$, at elevated temperatures (for example 180° C., as in the Mond process). The nickel coated high density graphite fibers are then placed around a current collector and sintered together using heat and pressure to form the electrode grid. "High density graphite fibers" refer to fibers having a density of more than 1.80 g/cm$^3$, preferably more than 1.90 gm/cm$^3$, and more preferably more than 1.95 g/cm$^3$. The theoretical maximum density for graphite is 2.1 g/cm$^3$.

An example of a suitable graphite fiber is available from the Union Carbide Corporation, Carbon Products Division under the trade name "Thornel", Type P mat, Grade VMA. Union Carbide technical information bulletin No. 465-225 describes "Thornel" mat grade VMA as "composed of high-strength, high-modulus carbon or graphite filaments in a random-layered orientation. The fine diametered filaments are one to three inches long and are mechanically bonded to form a continuous web of material 0.4 inches thick, 22 inches wide that is supplied in rolls approximately 40 feet long." The bulletin also lists the following properties for "Thornel" mat grade VMA:

TABLE 1

TYPICAL PROPERTIES AND CHARACTERISTICS OF "THORNEL" MAT GRADE VMA

| PROPERTY | U.S. CUSTOMARY UNITS-VALUE |
|---|---|
| Filaments | |
| Tensile Strength lb/in$^2$ | 200,000 |
| Tensile Modulus × 10$^6$ lb/in$^3$ | 35 |
| Density lb/in$^3$ | .072 |
| Electrical Resistivity 10$^4$ ohm-cm | 12 |
| Diameter μ | 9 |
| Surface Area m$^2$/g | 0.4 |
| Carbon Assay % | 98 |
| pH - | 6 |
| Mat | |
| Areal density lb/ft$^2$ | 0.07 |
| Bulk Density lb/ft$^3$ | 2.25 |
| Tensile Strength (long) lb/in width | 0.8 |
| Tensile Strength (trans.) lb/in width | 0.8 |
| Electrical Resistivity (trans.) 10$^4$ ohm-cm | 7000 |
| Thermal Conductivity Thickness BTU in/h/ft$^2$ °F. | 0.24 |

William E. Chambers in an article entitled "Low-cost High-performance Carbon Fibers," *Mechanical Engineering*, December 1975, pp. 38-39 describes the process for making the "Thornel" Type P (pitch) carbon fibers. The dimensions of the fibers are not a critical feature of this invention, but rather are chosen for certain practical reasons. For example, the smaller the diameter of the fiber, the larger the effective area of the sintered nickel grid will be. Thus, it is contemplated that fibers with diameter less that the 9 microns may be used. On the other hand, short fibers will produce sintered nickel grids that require support screens and thus added weight. Tests have demonstrated that longer fibers (e.g., one to three inches) produce sintered nickel grids which do not require support screens.

Carbon or graphite fibers produced by charring or graphiticizing rayon, cellulose, or similar fibers have low densities and therefore are not suitable for this invention. Sinter nickel-coated grids made of these fibers swell and disintegrate during cycling of alkaline nickel cells. Unlike the dense graphite or carbon fibers used in the present invention, these lower density fibers appear to have larger pores or fissures which are not fully protected by the nickel coating from attack by the KOH electrolyte.

Nickel carbonyl, Ni(CO)$_4$, is a colorless, volatile, toxic, flammable, mobile liquid with a characteristic odor. It has a molecular weight of 170.75, a specific gravity of 1.32, a melting point of −25° C., and a boiling point of 43° C. The *Merck Index* 10th ed., states that Ni(CO)$_4$ "[o]xidizes in air: explodes at 60° C." Ni(CO)$_4$ is also very toxic having a maximum allowable concentration in air of 0.001 parts per million. For these reasons, extreme care and special equipment is required to confine the Ni(CO)$_4$ is this process.

The nickel plating step comprises exposing a heated high density graphite fiber mat to Ni(CO)$_4$ vapor in a confined space free of air. When the Ni(CO)$_4$ vapor comes in contact with the heated graphite, the Ni(CO)$_4$ decomposes depositing nickel metal on the surface of the graphite and releasing carbon monoxide (CO).

The preferred method of performing the nickel plating step is by using a modified Mond process. The conventional mond process is used to refine nickel ores. *Van Nostrand's Scientific Encyclopedia*, 5th ed., pp 1613-14 states, "...[i]n (2) the Mond process, the nickel oxide is combined with carbon monoxide (CO) to form nickel carbonyl gas, Ni(CO)$_4$. The impurities, including cobalt, are left as a solid residue. Upon further heating of the gas to about 180° C., the nickel carbonyl is decomposed, the freed nickel condensing on nickel shot and the carbon monoxide recycled. The Mond process also makes a nickel of 99.9% purity." Van Nostrand's, supra, page 1615, also states that "Ni(CO)$_4$ is prepared by reaction of carbon monoxide with freshly reduced nickel, which occurs at ordinary temperatures and pressures." *The Merck Index*, 10th ed., Monograph number 6342. *Nickel Carbonyl*, states "made by passing carbon monoxide over finely divided nickel: Mond et al. *J. Chem Soc*, 57, 749 (1890); Gilliland, Blanchard,*Inorq. Syn.* 2, 234 (1946)...." In the modified process used in this invention, carbon monoxide is passed over reduced fine nickel powder at a temperature at which the product Ni(CO)$_4$ is a gas but below the temperature at which Ni(CO)$_4$ decomposes. The high density graphite fiber mats are heated to a temperature above the decomposition temperature of Ni(CO)$_4$ and placed into a chamber (free of air) into which the Ni(CO)$_4$ gas is fed. The high density graphite mats are preferably heated to a temperature of from 125° C. to 600° C., more preferably from 160° C. to 500° C., and still more preferably from 180° C. to 350° C. Upon contacting the heated dense graphite fiber mat, the Ni(CO)$_4$ decomposes, depositing pure (99.9%) nickel metal on the graphite surface and generating carbon monoxide which is preferably recycled to produce more Ni(CO)$_4$. When the desired thickness of nickel coating is achieved, the nickel coated graphite fiber mats are removed for the sintering step. Conventional means such as infrared, resistance, or inductive heating may be used to heat the graphite fiber mats during this Ni(CO)$_4$ decomposition nickel plating process. An electric current may be passed through a graphite mat because graphite is an electrical conductor. The electrical resistance of the graphite generates heat in the mat. An inductive furnace may also be used to heat the graphite mat. The Ni(CO)$_4$ gas which is not an electrical conductor will not be heated. The chamber containing the graphite mat and Ni(CO)$_4$ gas must be a nonconductor so that it does not heat up. If the chamber inner walls heat up, Ni(CO)$_4$ gas will decompose on them and deposit nickel metal.

To produce an electrode grid structure the nickel coated graphite fiber mats are sintered on to a strong, lightweight current collector. Thin nickel strips will work well as the current collector, referring to the figure, one piece of nickel coated graphite fiber mat 10 is placed on each side of a strong, light weight current collector 12. This sandwich is then placed between two ceramic tile plates 14 which are then placed between two stainless steel plates 16. The stainless steel plates are then compressed (e.g., in a carver hydrolic press) until the sandwich of nickel coated graphite fiber mats 10 and current collector 12 is of the desired thickness. The stainless steel plates 16 are then bolted together to maintain compression on the sandwich during sintering. The compressed nickel coated graphite fiber mats 10 are then sintered at a temperature of preferably from about 775° C. to 975° C., more preferably from 800° C. to 950° C., and still more preferably from 810° C. to 900° C. in a hydrogen (reducing) atmosphere. The ceramic tiles 14 may be replaced by coating the steel plates 16 with MgO, a parting agent. The current collecter may also be attached to a sintered nickel metal coated graphite fiber mat later by other known means such as riveting. However, sintering is the least expensive, most effective method of attaching the nickel coated graphite mats to the current collector.

A sintered nickel coated dense graphite fiber mat electrode grid produced by this invention may then be impregnated with active materials such as nickel hydroxide, nickel oxide, mixtures of nickel hydroxide and nickel oxide, cadmium hydroxide, cadmium oxide, or mixtures of cadmium hydroxide and cadmium oxide to produce, for example, nickel or cadmium electrodes. William A. Ferrando and Raymond A. Sutula in U.S. Pat. No. 4,215,190, herein incorporated in its entirety, at Example 3, columns 5-6, disclose a typical method of impregnating active material which will work for the grids of the present invention.

The general nature of the invention having been set forth, the following examples are presented as specific illustrations thereof. It will be understood that this invention is not limited to these specific examples, but is susceptible to various modifications that will be recognized by one of ordinary skill in the art.

EXAMPLE

Figure 2:
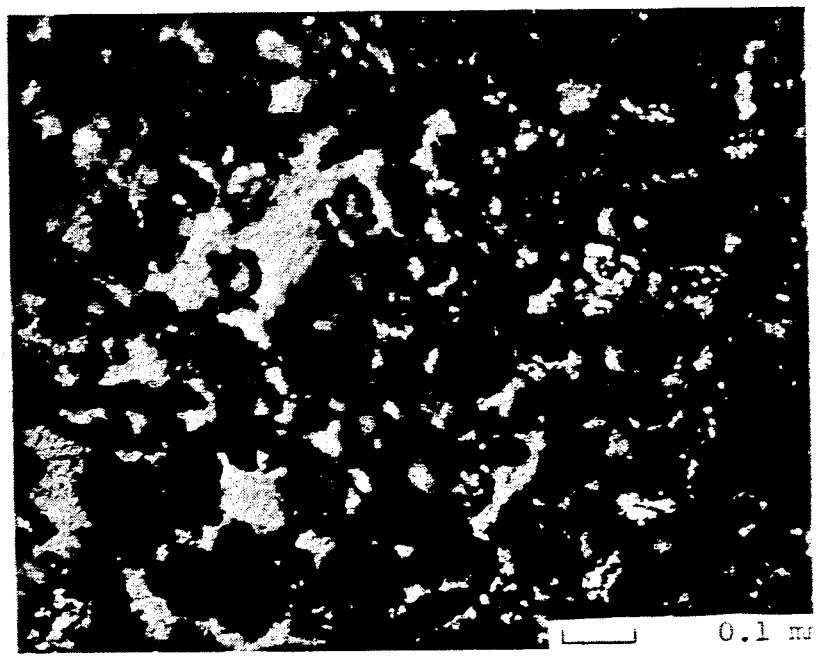
FIG. 2 is an optical photograph of nickel coated graphite particles produced from graphite powder by using with a Ni(CO)$_4$ decomposition process.
Figure 3:
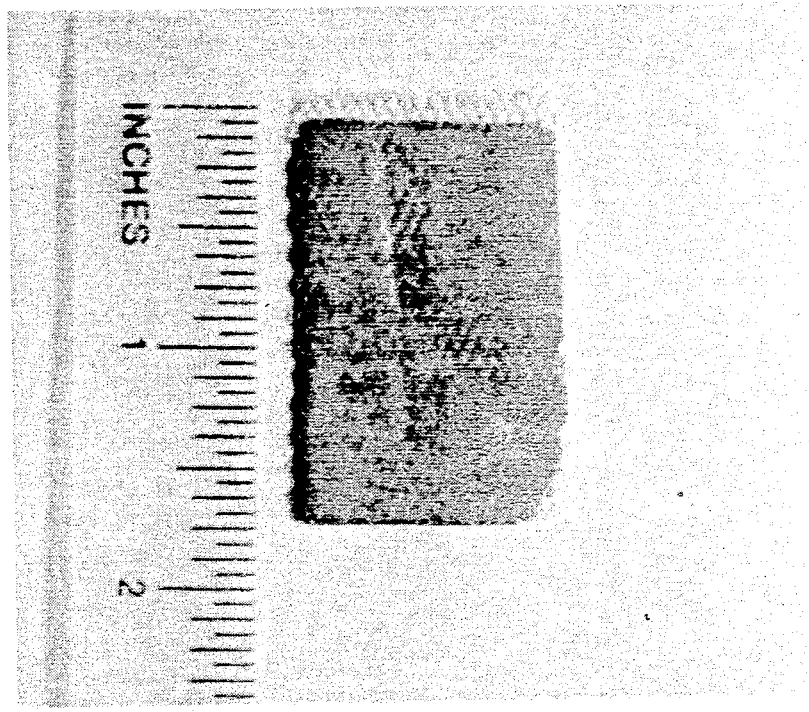
FIG. 3 shows a small plaque cut from a sinter of the nickel coated graphite particles.
Figure 4:
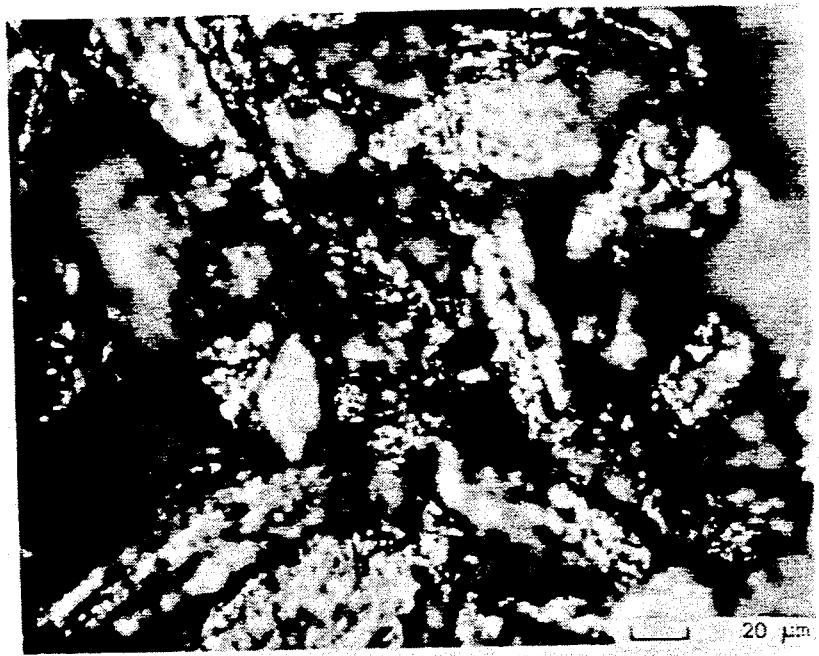
FIG. 4 is an optical micrograph of a portion of that small plaque.

The nickel coated graphite composite powder used in this example was manufactured by Sherritt-Gordon Mines, limited, Alberta, Canada using $Ni(CO)_4$ in a Mond process. The composite powder was composed of 50 weight percent of pure nickel and 50 weight percent of graphite. FIG. 2 is an optical photograph of particles of the composite powder. The particles are of typically random circular shape. The nickel coating is evident on particles with proper angle to the light source. A portion of this nickel coated graphite powder was spread on a stainless steel plate dagged with MgO as a release agent. A second steel plate (with MgO coating) was compressed onto the nickel coated graphite powder and the steel plates were bolted together to maintain the compression. The compressed sandwich of steel plates and nickel coated graphite powder was placed in an air tight Inconel sleeve and sintered for 2 hours at 810° C. in pure $H_2$ atmosphere. Sintering of the composite powder was achieved. FIG. 3 shows a small plaque cut from the sinter. FIG. 4 shows an optical micrograph of a portion of the plaque. Sintering has occurred and the plaque could be impregnated with active material, although the relatively large particle size produced a less than ideal porous structure.

This example, demonstrates that nickel coated graphite materials such as powders or fibers can be sintered together.

As will be evident to those skilled in the art, various modifications can be made, or followed, in light of the foregoing disclosure and discussion, without departing from the spirit or the scope of the disclosure or the scope of the claims.

What is claimed as new and desired to be secured by Letters Patent of the United States is:

1. A process for producing a lightweight electrode grid comprising:
   A. heating a mat of dense graphite fibers to a temperature at which $Ni(CO)_4$ decomposes;
   B. exposing the heated mat of graphite fibers to $Ni(CO)_4$ gas which is at a temperature above the vaporization temperature of $Ni(CO)_4$ but below the decomposition temperature of $Ni(CO)_4$,
   wherein the $Ni(CO)_4$ decomposes when it contacts the heated graphite fibers and deposits nickel metal on the graphite fiber surfaces;
   C. removing the heated graphite fiber mat from the $Ni(CO)_4$ gas when the desired thickness of nickel metal coating has been produced on the graphite fiber mat; and
   D. sintering the nickel coated graphite fiber mat in a reducing atmosphere under heat and pressure to compress the mat to a desired thickness and to fuse the nickel metal coated graphite fibers together.

2. The process of claim 1 wherein in the sinter process of step D the nickel coated graphite fiber mat is attached to a current collector.

3. The process of claim 1 wherein the mat of dense graphite fibers is heated in step A to a temperature of from 125° C. to 600° C.

4. The process of claim 3 wherein the mat of dense graphite fibers is heated in step A to a temperature of from 160° C. to 500° C.

5. The process of claim 4 wherein the mat of dense graphite fibers is heated in step A to a temperature of from 180° C. to 350° C.

6. The process of claim 1 wherein heating means are used in step B to maintain the temperature of the mat of graphite fibers.

7. The process of claim 1 wherein the carbon monoxide generated by the decomposition of $Ni(CO)_4$ in step B is taken and reacted with fine nickel metal powder to produce more $Ni(CO)_4$ gas for use in step B.

8. The process of claim 1 wherein the reducing atmosphere used in step D is pure hydrogen gas.

9. The process of claim 1 wherein the sintering temperature in step D is from about 775° C. to about 975° C.

10. The process of claim 9 wherein the sintering temperature in step D is from 800° C. to 950° C.

11. The process of claim 10 wherein the sintering temperature in step D is from 810° C. to 900° C.

* * * * *